(12) United States Patent
Udrea et al.

(10) Patent No.: US 12,432,950 B2
(45) Date of Patent: Sep. 30, 2025

(54) INSULATED GATE BIPOLAR TRANSISTOR INCLUDING TRENCH SCHOTTKY ELECTRODE

(71) Applicant: Hitachi Energy Ltd, Zürich (CH)

(72) Inventors: Florin Udrea, Cambridge (GB);
Marina Antoniou, Cambridge (GB);
Neophytos Lophitis, Hinckley (GB);
Chiara Corvasce, Bergdietikon (CH);
Luca De-Michielis, Aarau (CH);
Umamaheswara Vemulapati, Windisch (CH); Uwe Badstuebner, Zurich (CH);
Munaf Rahimo, Gänsbrunnen (CH)

(73) Assignee: Hitachi Energy Ltd, Zürich (CH)

( * ) Notice: Subject to any disclaimer, the term of this patent is extended or adjusted under 35 U.S.C. 154(b) by 738 days.

(21) Appl. No.: 17/774,555

(22) PCT Filed: Nov. 6, 2020

(86) PCT No.: PCT/EP2020/081331
§ 371 (c)(1),
(2) Date: May 5, 2022

(87) PCT Pub. No.: WO2021/089808
PCT Pub. Date: May 14, 2021

(65) Prior Publication Data
US 2022/0393023 A1   Dec. 8, 2022

(30) Foreign Application Priority Data

Nov. 8, 2019   (EP) .................................... 19208174
Nov. 20, 2019  (EP) .................................... 19210476

(51) Int. Cl.
*H10D 62/10*   (2025.01)
*H10D 12/00*   (2025.01)
(Continued)

(52) U.S. Cl.
CPC ......... *H10D 12/461* (2025.01); *H10D 62/127* (2025.01); *H10D 62/393* (2025.01); *H10D 64/64* (2025.01)

(58) Field of Classification Search
CPC ............. H01L 29/7396; H01L 29/0696; H01L 29/1095; H01L 29/47; H01L 29/0623;
(Continued)

(56) References Cited

U.S. PATENT DOCUMENTS 4,553,151 A * 11/1985 Schutten .............. H10D 30/611
257/E29.264
6,417,554 B1   7/2002 Ahmed
(Continued)

FOREIGN PATENT DOCUMENTS

CN   101719495 A   6/2010
CN   103748685 A   4/2014
(Continued)

OTHER PUBLICATIONS

Feng, Hao, et al., "A Low Recovery Loss Reverse-Conducting IGBT with Metal/P-body Schottky Junctions for Hard-Switching Applications", ECS Journal of Solid State Science and Technology, 5 (2), Dec. 5, 2015, pp. Q61-Q67.
(Continued)

*Primary Examiner* — Ida M Soward
(74) *Attorney, Agent, or Firm* — Slater Matsil, LLP (57) ABSTRACT

An insulated gate bipolar transistor includes a source electrode, a collector electrode, a source layer, a base layer, a drift layer and a collector layer. Trench gate electrodes extend through the base layer into the drift layer. A channel is located between the source layer, the base layer and the drift layer. A trench Schottky electrode is adjacent to one of the trench gate electrodes and includes an electrically conductive Schottky layer arranged lateral to the base layer and
(Continued)

extends through the base layer into the drift layer. The Schottky layer is electrically connected to the source electrode. Collection areas are located in the drift layer at a respective trench gate electrode bottom of the trench gate electrodes or of the trench Schottky electrode. The Schottky layer forms a Schottky contact to the collection area at a contact area.

20 Claims, 5 Drawing Sheets

(51) Int. Cl.
    *H10D 62/17*     (2025.01)
    *H10D 64/64*     (2025.01)

(58) Field of Classification Search
    CPC .......... H01L 29/42376; H01L 29/7397; H01L 29/407; H01L 29/417; H10D 12/461; H10D 62/127; H10D 62/393; H10D 62/605; H10D 62/364; H10D 62/875; H10D 64/64; H10D 48/34
    See application file for complete search history.

(56) References Cited

U.S. PATENT DOCUMENTS

| | | | |
|---|---|---|---|
| 7,728,382 B2 | 6/2010 | Tsuzuki et al. | |
| 8,076,719 B2 * | 12/2011 | Zeng | H10D 62/111 |
| | | | 257/334 |
| 9,076,861 B2 * | 7/2015 | Darwish | H10D 84/146 |
| 9,224,844 B2 | 12/2015 | Ogura et al. | |
| 9,653,599 B2 | 5/2017 | Kobayashi et al. | |
| 9,941,381 B2 | 4/2018 | Qu et al. | |
| 10,468,511 B2 | 11/2019 | Ogura et al. | |
| 10,707,299 B2 * | 7/2020 | Shiomi | H10D 12/031 |
| 11,282,937 B2 | 3/2022 | Mori et al. | |
| 2001/0025984 A1 * | 10/2001 | Osawa | H10D 64/117 |
| | | | 257/E29.066 |
| 2010/0264488 A1 * | 10/2010 | Hsieh | H10D 30/0295 |
| | | | 257/334 |
| 2010/0301410 A1 * | 12/2010 | Hirler | H10D 30/668 |
| | | | 257/334 |
| 2012/0043602 A1 * | 2/2012 | Zeng | H10D 30/0297 |
| | | | 257/329 |
| 2012/0217540 A1 | 8/2012 | Hirler | |
| 2013/0082302 A1 | 4/2013 | Nakamura et al. | |
| 2014/0021509 A1 | 1/2014 | Qu et al. | |
| 2014/0124831 A1 | 5/2014 | Rahimo et al. | |
| 2014/0167151 A1 | 6/2014 | Yen et al. | |
| 2014/0175508 A1 | 6/2014 | Suzuki et al. | |
| 2015/0079894 A1 | 3/2015 | Zimmerman | |
| 2015/0263148 A1 | 9/2015 | Ogura et al. | |
| 2017/0271441 A1 | 9/2017 | Hu et al. | |
| 2017/0271490 A1 | 9/2017 | Ogura et al. | |
| 2018/0308972 A1 | 10/2018 | Ohse et al. | |
| 2019/0058057 A1 | 2/2019 | Eckel et al. | |
| 2019/0288104 A1 | 9/2019 | Kinoshita | |

FOREIGN PATENT DOCUMENTS

| | | | | |
|---|---|---|---|---|
| EP | 3471147 A1 | 4/2019 | | |
| JP | 2014127555 A | 7/2014 | | |
| JP | 2015079894 A | 4/2015 | | |
| JP | 2015177058 A | 10/2015 | | |
| JP | 2016167598 A | 9/2016 | | |
| JP | 2017079251 A | 4/2017 | | |
| JP | 2017168638 A | 9/2017 | | |
| JP | 2019149511 A | 9/2019 | | |
| WO | 9952152 A1 | 10/1999 | | |
| WO | 2012103968 A1 | 8/2012 | | |
| WO | WO-2016006696 A1 * | 1/2016 | ............ | H01L 29/06 |
| WO | WO-2016199390 A1 * | 12/2016 | ............ | H01L 21/049 |

OTHER PUBLICATIONS

European Patent Office, International Search Report and Written Opinion of the International Searching Authority, PCT/EP2020/081331, Dec. 4, 2020, 14 pages.

* cited by examiner

INSULATED GATE BIPOLAR TRANSISTOR INCLUDING TRENCH SCHOTTKY ELECTRODE

CROSS-REFERENCE TO RELATED APPLICATIONS

This application is a national stage application of International Application No. PCT/EP2020/081331, filed on Nov. 6, 2020, which claims priority to European Patent Application No. 19208174.3, filed on Nov. 8, 2019, and European Patent Application No. 19210476.8, filed on Nov. 20, 2019, which applications are hereby incorporated herein by reference.

TECHNICAL FIELD

The invention relates to the field of power semiconductor devices, such as an Insulated Gate Bipolar Transistor (IGBT).

BACKGROUND

Figure 1:
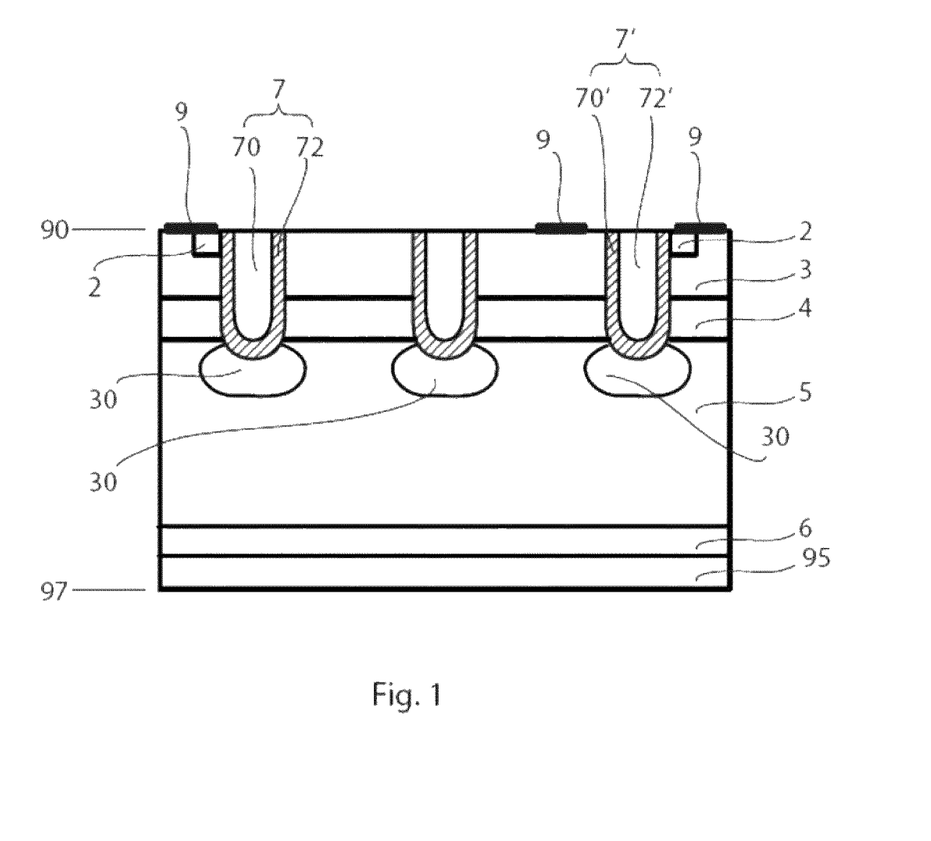
FIG. 1 shows an IGBT with a trench gate electrode.

Prior art IGBTs having trench Metal-Oxide-Semiconductor (MOS) cells designs as shown in FIG. 1 have, e.g., a trench gate electrode 7 with a gate layer 70, which is electrically insulated from a p doped base layer 3, an n+-doped source layer 2 and an n-doped drift layer 5 by a gate insulating layer 72. The trench gate electrode 7 is arranged in the same plane and lateral to the base layer 3 and extends deeper into the drift layer 5 than the base layer 3.

With such trench gate electrode designs, the on-state losses are lower than for planar gate designs, because the trench design offers a vertical MOS channel, which provides enhanced injection of electrons in the vertical direction and suffers from no drawbacks from charge spreading (so called JFET effect) near the cell. Therefore the trench cells show much improved carrier enhancement for lower losses. Due to the vertical channel design, the trench offers also less hole drain effect (PNP effect) due to the improved electron spreading out of the MOS channel than for planar gate designs. At the bottom of the trench there is an accumulation layer, which offers strong charge enhancement for the PIN diode part. Hence wide and/or deep trenches show optimum performance.

The trench design offers large cell packing density for reduced channel resistance. The trench design, however, suffers from lower blocking capability near the bottom corners of the trenches due to high peak electric fields. The trench design has a large MOS accumulation region below the trench gate and associated capacitance with difficulty to apply field oxide type layers in the trench for Miller capacitance reduction. Therefore, the prior art device as shown in FIG. 1 results in bad controllability and high switching losses. Furthermore, the high cell densities in trench designs will result in high short circuit currents.

US 2017271490 A1 discloses a semiconductor device including a third electrode between a first semiconductor region and a second electrode, a fourth electrode between the first semiconductor region and the second electrode, a second semiconductor region between the first semiconductor region and the second electrode and between the third electrode and the fourth electrode, a third semiconductor region between the second semiconductor region and the second electrode, a fourth electrode between the first semiconductor region and the second electrode to be electrically connected to the second electrode, and a fifth semiconductor region between the first electrode and the first semiconductor region. A first insulating film is provided between the third electrode and the first semiconductor region, the second semiconductor region, the third semiconductor region and the second electrode. A second insulating film is provided between the fourth semiconductor region and the first semiconductor region, the second semiconductor region, and the fourth semiconductor region.

US 2015263148 A1 discloses a semiconductor device including a first electrode, a second electrode, a first semiconductor layer, a first semiconductor region, a second semiconductor region, and an insulating layer. The first semiconductor layer is provided between the first electrode and the second electrode, and contacts the first electrode. The first semiconductor region is provided between the first semiconductor layer and the second electrode, and contacts the second electrode. The second semiconductor region is provided between the first semiconductor region and the second electrode, and contacts the second electrode. An impurity concentration of the second semiconductor region is higher than an impurity concentration of the first semiconductor region. An insulating layer has one end contacting the second electrode and the other end positioned in the first semiconductor layer. The insulating layer extends along the second electrode in a first direction from the first electrode towards the second electrode.

U.S. Pat. No. 6,417,554 B1 discloses a three layer IGBT which cannot latch on and is provided with a trench gate and a Schottky contact to the depletion region surrounding the trench gate. An emitter contact is connected to base diffusion regions which are diffused into the depletion region. The depletion region is formed a top an emitter region which emits carriers into the depletion region in response to the turn on of the gate and the injection of carriers from the Schottky gate.

EP 3 471 147 A1 discloses an IGBT comprising at least two first cells, each of which having an n doped source layer, a p doped base layer, an n doped enhancement layer, wherein the base layer separates the source layer from the enhancement layer, an n– doped drift layer and a p doped collector layer. Two trench gate electrodes are arranged on the lateral sides of the first cell. The transistor comprises at least one second cell between the trench gate electrodes of two neighbored first cells, which has on the emitter side a p+ doped well and a further n doped enhancement layer which separates the well from the neighbored trench gate electrodes. An insulator layer stack is arranged on top of the second cell on the emitter side to insulate the second cell and the neighbored trench gate electrodes from the metal emitter electrode, which consists of a first insulating layer and a second insulating layer, wherein the insulator stack has a thickness on top of the well of a first layer thickness plus the second insulating layer thickness and a thickness on top of the gate layer of the second insulating layer thickness, wherein each thickness of the first insulating layer and the second insulating layer is at least 700 nm.

SUMMARY

Embodiments of the present invention provide a power semiconductor device with a degradation-improved path for holes escaping during turn-off events, while maintaining the static losses at low level with respect to standard contact equivalent solutions.

Exemplarily, an insulated gate bipolar transistor according to an embodiment of the invention comprises at least following layers from a source electrode on an emitter side to a collector electrode on a collector side opposite to the emitter side: at least a source layer of a first conductivity type; a base layer of a second conductivity type, which is different from the first conductivity type, wherein the source layer and the base layer electrically contact the source electrode; and a drift layer of the first conductivity type. The insulated gate bipolar transistor furthermore comprises a collector layer of the second conductivity type, which is arranged between the drift layer and the collector electrode and which electrically contacts the collector electrode; at least two trench gate electrodes extending through the base layer into the drift layer, each of the at least two trench gate electrodes comprises an electrically conductive gate layer, which is arranged lateral to the base layer and a gate insulating layer, which separates the gate layer from any doped layer; wherein a channel is formable between the source layer, the base layer and the drift layer. At least one trench Schottky electrode comprises an electrically conductive Schottky layer, which is arranged lateral to the base layer and extends through the base layer into the drift layer, and wherein the Schottky layer is electrically connected to the source electrode, and a Schottky insulating layer, which separates the Schottky layer from the base layer. Collection areas of the second conductivity type are arranged at a trench gate electrode bottom of the at least two trench gate electrodes and at a trench Schottky electrode bottom of the at least one trench Schottky electrode. The collection areas are located in the drift layer and are laterally separated from each other by the drift layer; wherein the Schottky layer forms a Schottky contact to the collection area at a contact area.

Further advantages according to the present invention will be apparent from the dependent claims.

BRIEF DESCRIPTION OF THE DRAWINGS

The subject matter of embodiments of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

DETAILED DESCRIPTION OF ILLUSTRATIVE EMBODIMENTS

Examples of embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance.

It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections may not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

It furthermore should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

Figure 2:
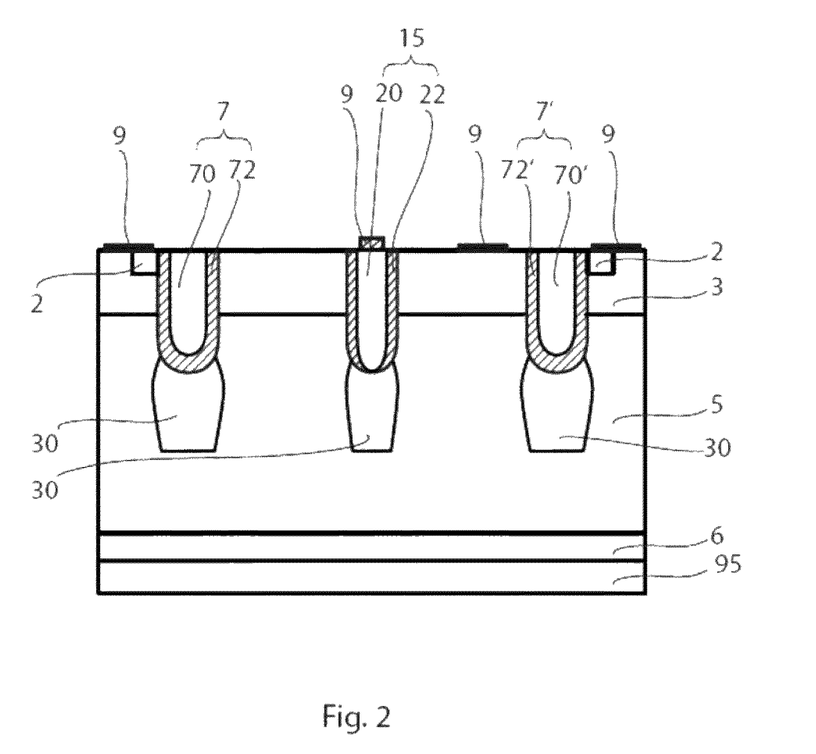
FIG. 2 shows another IGBT with a Schottky Source/Cathode contact according to an embodiment of the present invention.

In one embodiment, shown in FIG. 2, the insulated gate bipolar transistor comprises at least following layers from a source electrode 9 on an emitter side 90 to a collector electrode 95 on a collector side 97 opposite to the emitter side 90: a source layer 2 of a first conductivity type, a base layer 3 of a second conductivity type, which is different from the first conductivity type, and a drift layer 5 of the first conductivity type. The source layer 2 and the base layer 3 electrically contact the source electrode 9.

According to one embodiment, the drift layer may be formed from a bulk material having a low, substantially constant, low doping concentration of first conductivity type. "Low doping concentration" in this context means e.g. lower than the doping concentration of e.g. the source layer 2. Therein, the substantially constant doping concentration of the drift layer 5 means that the doping concentration is substantially homogeneous throughout the drift layer 5, however without excluding that fluctuations in the doping concentration within the drift layer being in the order of a factor of one to five may be possibly present due to e.g. a fluctuation in the epitaxial growth process. The first conductivity type may be of n-type and a low doping concentration of the bulk material may be for power devices (voltage above 600 V) in the range of $1*10^{12}$ to $5*10^{14}/cm^3$.

The insulated gate bipolar transistor further comprises a collector layer 6 of the second conductivity type, which is arranged between the drift layer 5 and the collector electrode 95 and which electrically contacts the collector electrode 95. At least two trench gate electrodes 7, 7', extend through the base layer 3 into the drift layer. Each of the at least two trench gate electrodes 7, 7 comprises an electrically conductive gate layer 70, 70', which is arranged lateral to the base layer 3 and a gate insulating layer 72, 72', which separates the gate layer 70, 70' from any doped layer.

A channel is formable between the source layer 2, the base layer 3 and the drift layer 5.

The insulated gate bipolar transistor further comprises at least one trench Schottky electrode 15 comprising an electrically conductive Schottky layer 20, which is arranged lateral to the base layer 3 and extends through the base layer 3 into the drift layer 5. The Schottky layer 20 is electrically connected to the source electrode 9. The insulated gate bipolar transistor further comprises Schottky insulating layer 22, which separates the Schottky layer 20 from the base layer 3.

Collections areas 30 of the second conductivity type are arranged at a trench gate electrode bottom of the at least two trench gate electrodes 7, 7' and at a trench Schottky electrode bottom of the at least one trench Schottky electrode 15. The collection areas 30 are located in the drift layer 5 and are laterally separated by the drift layer 5. The Schottky layer 20 forms a Schottky contact to the collection area 30 at a contact area. A Schottky contact is a metal-semiconductor contact having a large barrier height and a low doping concentration that is less than the density of states in the conduction band or valence band. Contrary thereto, an ohmic contact is defined as a metal-semiconductor contact that has a negligible contact resistance relative to the bulk or series resistance of the semiconductor. An ohmic contact also can be defined as a junction between two conductors that has a linear current (I)-voltage(V) curve as with Ohm's law $R*I=U$. The base layer 3 of the second conductivity type is separated by the drift layer 5 of the first conductivity type from the collection area 30 of the second conductivity type.

For manufacturing an inventive insulated gated bipolar transistor e.g. the following manufacturing steps are performed.

An IGBT with collection areas 30 in form of rings, e.g., p doped, as shown, e.g., in FIG. 1 is provided. The Schottky insulating layer 22, e.g., formed as a gate oxide, in a dummy trench Schottky electrode 15 is removed such that the trench Schottky electrode 15 is opened at its bottom. A dummy trench in this context is a trench which is isolated from the gate trenches and which is connected with the source electrode. The opening in the bottom of the trench forms a contact area between the Schottky layer 20 and the collection area 30. The collection areas 30 of the second conductivity type may be formed by implanting dopants, e.g. Boron, through the bottom opening in the Schottky electrode 15.

In one embodiment, the mean doping concentration of the collection areas (p-ring doping) may be in a range from $5*e^{15}/cm^3$ to $5*e^{17}/cm^3$, e.g., $3*e^{17}/cm^3$. In one embodiment, the mean doping concentration of the Schottky contacts in the contact area may be in a range from $1*e^{15}/cm^3$ to $5*e^{16}/cm^3$, e.g., $1*e^{16}/cm^3$.

Another way of manufacturing the collection areas 30 of the second conductivity type may be an epitaxial growing of the collection areas 30 on the bulk material of first conductivity type. The method of epitaxial growing may be used for deep collection areas 30, as they are used e.g. for SuperJunction IGBTs. The term "deep" in this context refers to a depth at which the doping can no longer be formed by ion-implantation, e.g. deeper than 1 μm. Therein, the depth of certain position means a distance of that position from the emitter side 90.

SuperJunction was a big step towards the ideal device with inherent drastic reduction of the ON state resistance and of the conduction losses for power devices. SuperJunction is not an improvement due to the use of a new material. It is an improvement derived by an innovative design concept for the sustaining layer that, instead of exhibiting a one dimensional (planar) structure, it is manufactured with a complex two or three dimensional structure. SuperJunction devices are based on the idea of charge balancing. The drift region of SuperJunction devices has multiple e.g., p columns, which cancel the charge in the surrounding n regions under reverse bias. As a result, the drift region can now be higher doped since the combined structure offers a much higher resistance to applied reverse voltage. As the n region becomes more heavily doped, its on-resistance per unit area decreases. SuperJunction design technique is therefore applicable to different power devices but requires a design approach that differs from the one used for conventional (planar) power devices.

By the opening of the trench Schottky electrode 15, a Schottky metal/semiconductor contact is formed between the Schottky layer 20 and the collection areas 30. Therefore the collection of holes occurs through a p type conductivity region (collection areas 30) connected through the Schottky contact to the emitter/source/cathode of the IGBT. The shape of the Schottky barrier height and width of the Schottky contact in the energy band diagram may be adjusted by controlling the doping concentration at the surface or the work function of the Schottky layer 20, e.g. metal layer or stack of metal layers, in order to control the amount of holes collected by this terminal. Therefore this also adjusts the electron injection at the emitter side 90 of the drift layer 5. The higher the charge accumulation is, the lower is the on-state voltage drop. Hence the Schottky contact allows for the control of the holes collection and better adjustment of the $E_{off}$, $V_s$, $V_{on}$ trade-off.

In all embodiments described in this specification, the doping concentration at the interface with the Schottky contact or the work function of the Schottky layer 20 may be adjusted to control the amount of holes collected on the emitter side 90, and therefore to control the electron injection at the part of the drift layer 5 on the emitter side of the IGBT. In solid-state physics, the work function is the minimum thermodynamic work (i.e., energy) needed to remove an electron from a solid to a point in the vacuum immediately outside the solid surface, it is therefore defined as the energy difference between the Fermi energy and the vacuum level. The work function of the Schottky layer 20 is the energy necessary to overcome the Schottky barrier (potential energy barrier for electrons formed at a metal-semiconductor junction) which depends on the combination of metal and semiconductor.

Figure 3:
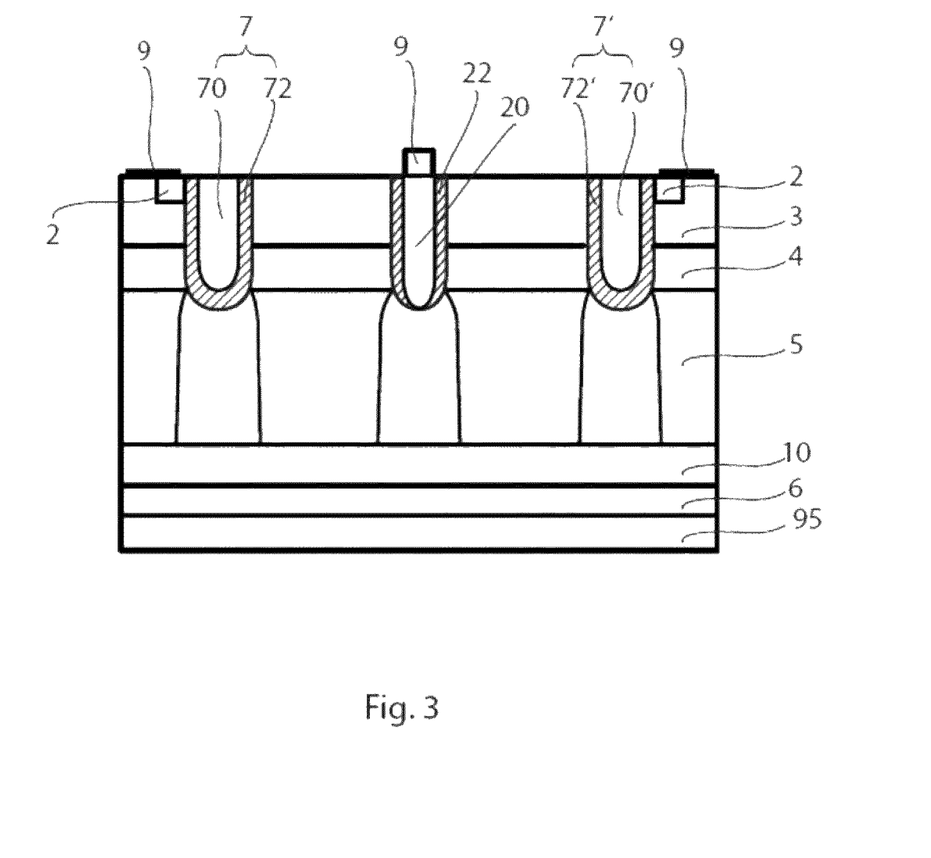
FIG. 3 shows another IGBT with a Schottky Source/Cathode contact according to another embodiment of the present invention.

In another embodiment, shown in FIG. 3, a buffer layer 10 of the first conductivity type is arranged between the collector layer 6 and the drift layer 5. The collection areas 30 of the second conductivity type extend vertically through the drift layer 5 from the trench gate electrodes 7, 7' and the trench Schottky electrode 15 to the buffer layer 10. The buffer layer 10 has a higher doping concentration than the drift layer 5. This structure forms a full SuperJunction IGBT structure with the collection areas 30 (e.g., p-layer) formed at the trench gate electrode bottoms and the Schottky electrode bottom and the Schottky contact placed in at least one of the trenches. Although in the specific embodiment of FIG. 3 an enhancement layer 4 is disclosed, similar to the embodiment above, the enhancement layer 4 may be skipped, as long as the base layer 3 of the second conductivity type is separated by the drift layer 5 of the first conductivity type from the collection area 30 of the second conductivity type. The enhancement layer 4 has a higher doping concentration than the drift layer 5. In one embodiment, the maximum doping concentration of the enhancement layer 4 may be between $1*10^{15}$ to $5*10^{16}/cm^3$.

Exemplarily, the drift layer 5 has a constantly low doping concentration (low compared to the doping concentration exemplarily of the other layers like the buffer layer 10 or the enhancement layer 4). Therein, the substantially constant doping concentration of the drift layer 5 means that the doping concentration is substantially homogeneous throughout the drift layer 5, however without excluding that fluctuations in the doping concentration within the drift layer 5 being in the order of a factor of one to five may be possibly present due to manufacturing reasons.

Figure 4:
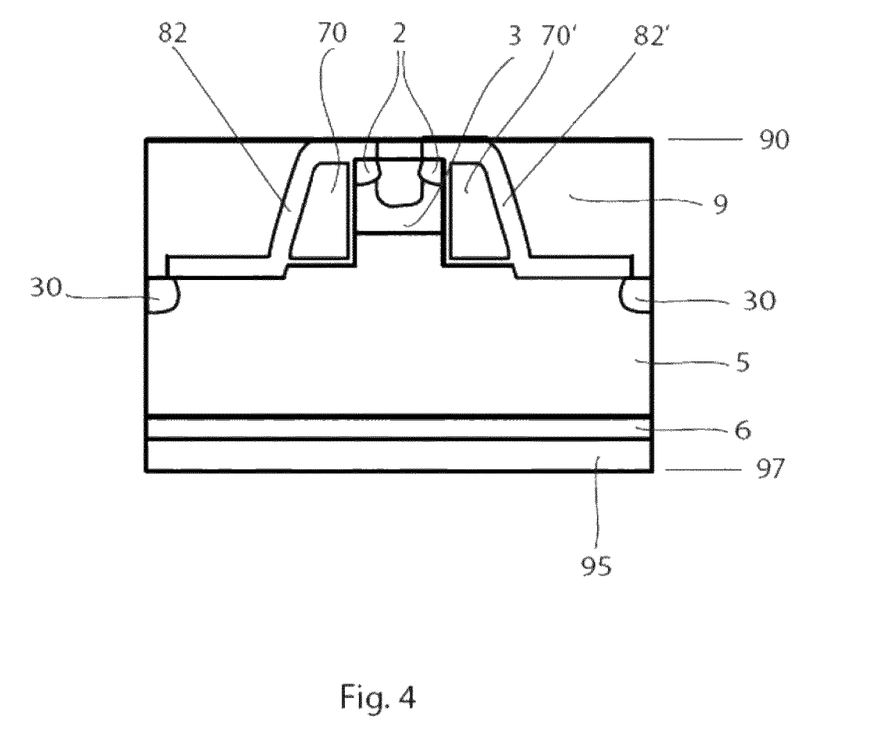
FIG. 4 shows another IGBT with a Schottky Source/Cathode contact according to another embodiment of the present invention.

In another embodiment, in a split gate IGBT structure shown in FIG. 4, the collection area 30 (p-layer) is formed under the gate trench in the drift layer 5. Because the collection area 30 (p-layer) is formed on the surface of the bulk material, it can be doped, e.g. by implantation into the surface, before the other elements of the device, like gate structure, base layer, source layer, are formed on top of the bulk material.

The insulated gate bipolar transistor comprises at least following layers from a source electrode 9 on an emitter side 90 to a collector electrode 95 on a collector side 97 opposite to the emitter side 90: a source layer 2 of a first conductivity type, a base layer 3 of a second conductivity type, which is different from the first conductivity type, wherein the source layer 2 and the base layer 3 electrically contact the source electrode 9, the drift layer 5 is of the first conductivity type, a collector layer 6 of the second conductivity type, which is arranged between the drift layer 5 and the collector electrode 95 and which electrically contacts the collector electrode 95, at least two trench gate electrodes 7, 7' extending deeper to the drift layer 5 than the base layer 3, each of the at least two trench gate electrodes 7, 7' comprises an electrically conductive gate layer 70, 70', which is arranged lateral to the base layer 3 and field plates 82, 82', which separate the gate layer 70, 70' from any doped layer, wherein a channel is formable between the source layer 2, the base layer 3 and the drift layer 5.

Field plates are used in power devices to manipulate and reshape electric field distribution to reduce the maximum electric field of these devices when high voltages are applied to the drain/collector electrode. By reducing the maximum electric field, field plates increase the breakdown voltage and therefore achieve operations at higher voltages. The field plates 82, 82' may be formed as an oxide. The thickness of the field plates 82, 82' may larger than 0.2 m.

The insulated gate bipolar transistor furthermore comprises collection areas 30 of the second conductivity type arranged in the drift layer 5 and electrically insulated from the gate layer 70, 70' by the field plates 82, 82', wherein the collection areas 30 are electrically connected with the source electrode 9 and form a Schottky contact with the source electrode 9 at a contact area.

In another embodiment, the collection areas 30 of the second conductivity type have a retrograde profile, so that a doping concentration of the second conductivity type at the contact area is lower than a doping concentration of the second conductivity type at the collector side 97 of the collection areas 30. The lower doping may form a Schottky contact at the surface for the collection of holes during turn off. The deeper doping concentration may serve for stopping the depletion region reaching the Schottky area and cause the device to break prematurely. Therefore the collection areas 30 (p-rings) may remain partly undepleted in the blocking state. This may be the case for all the p-ring regions using doping to form the Schottky contact, i.e., the surface may have a lower doping and depletion region may not be able to reach it under blocking. A lower doping at the surface may also be achieved through charge compensation at the trench bottom opening, i.e., by implantation of opposite polarity charge to lower the background doping.

Figure 5:
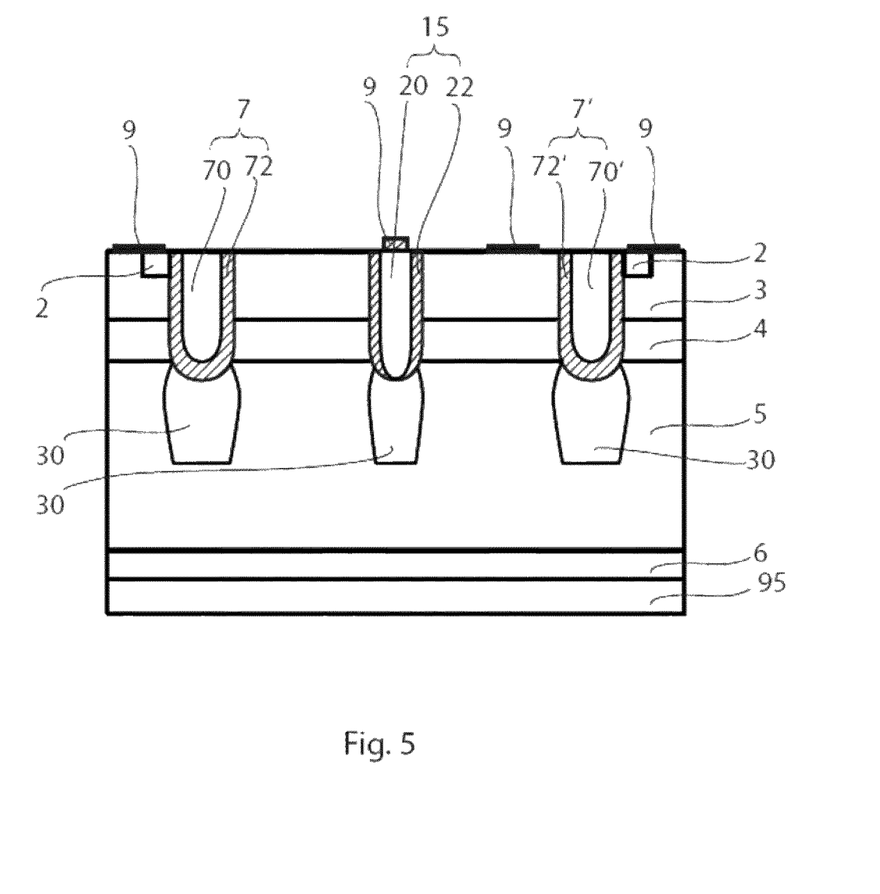
FIG. 5 shows another IGBT with a Schottky Source/Cathode contact according to another embodiment of the present invention.

In another exemplary embodiment of an IGBT device as shown, e.g., in FIG. 5, an enhancement layer 4 of the first conductivity type having higher doping concentration than the drift layer 5 is formed, wherein the enhancement layer 4 is formed between the base layer 3 and the drift layer 5 and wherein the trench electrodes 7, 7' and the Schottky electrode 15 extend through the enhancement layer 4 into the drift layer 5. One advantage of having the enhancement layer 4 is the enhancing of the on-state performance while the basic IGBT functionality—the combination of the simple gate-drive characteristics of MOSFETs with the high-current and low-saturation-voltage capability of bipolar transistors—is not changed.

The gate electrodes and the Schottky electrodes may be formed in a stripe-like design when viewing the IGBT device in plan view. However, the Schottky electrodes not necessarily have to be formed stripe-like, but also may be formed in a smaller part of the active area, e.g. square-like, or circular, so that the collection of holes through the Schottky contact is done in multiple direction. One advantage of this embodiment may be the improved control of the holes collection through a reduced area.

In another exemplary embodiment of an IGBT device, the collection of holes occurs through a combination of Schottky and ohmic contacts which could be placed on the same of different p type conductivity layers. Both, the Schottky and the ohmic, contacts are connected to the emitter and the ratio of their areas is important for a good trade-off between on-state voltage drop and safe operating area. The ohmic contact could be made of the same metallization as the Schottky contact and placed on a more highly doped p type layer than the Schottky contact, or could be made of different metallization layers.

In another exemplary embodiment of an IGBT device, the structure of the IGBT corresponds to the structure of the IGBT according to FIG. 1, but some of the source contacts on the surface of the device which do not contact the source layer form Schottky contacts with the base layer 3. One advantage of this structure is, that the forming of Schottky contacts on the surface of the device can be implemented into already existing device manufacturing processes easily. But even in a device without a p-ring structure as shown e.g. in FIG. 1—which then does not form an embodiment of the invention—, Schottky contacts connected to the emitter/source contact on the device surface enhance the control of the collection of holes through the base layer and allow an improved adjustment of $E_{off}$, $V_s$, $V_{on}$.

"Lateral" shall mean in this description that two layers/regions are arranged in a same plane, which plane lies parallel to the emitter side. Within that plane the layers are arranged lateral neighbored, side to side or adjacent to each other, whereas the layers may have a distance from each other, i.e. another layer may be arranged between the two layers, but they may also be directly adjacent to each other, i.e. in touch to each other. "Lateral sides" of a layer shall be the sides of an object perpendicular to the emitter side 90.

"Vertical" describes in this description the direction which is perpendicular to the emitter side 90, which is opposite to the collector side 97 of the insulated gate bipolar transistor.

The invention claimed is:

1. An insulated gate bipolar transistor comprising:
    a source electrode on an emitter side of the insulated gate bipolar transistor;
    a collector electrode on a collector side of the insulated gate bipolar transistor, the collector side being opposite the emitter side;
    a source layer of a first conductivity type;
    a base layer of a second conductivity type, which is different from the first conductivity type, wherein the source layer and the base layer electrically contact the source electrode;
    a drift layer of the first conductivity type spaced from the source electrode by the base layer;
    a collector layer of the second conductivity type arranged between the drift layer and the collector electrode, the collector layer electrically contacting the collector electrode;
    a plurality of trench gate electrodes extending through the base layer into the drift layer, each trench gate electrode of the plurality of trench gate electrodes comprising an electrically conductive gate layer arranged lateral to the base layer and a gate insulating layer that separates the electrically conductive gate layer from any doped layer, wherein a channel is located between the source layer, the base layer and the drift layer and wherein the source layer is arranged at least on one side of each trench gate electrode;
    a trench Schottky electrode adjacent to one of the trench gate electrodes, the trench Schottky electrode comprising an electrically conductive Schottky layer arranged lateral to the base layer and extending through the base layer into the drift layer, wherein the electrically conductive Schottky layer is electrically connected to the source electrode and a Schottky insulating layer separates the electrically conductive Schottky layer from the base layer; and
    a plurality of collection areas of the second conductivity type located in the drift layer and laterally separated from each other by the drift layer, a bottom portion of each trench gate electrode being adjacent to a respective one of the plurality of collection areas and a bottom portion of the trench Schottky electrode being adjacent to another respective one of the plurality of collection areas, wherein the electrically conductive Schottky layer forms a Schottky contact at a contact area between the bottom portion of the trench Schottky electrode and the another respective one of the plurality of collection areas.

2. The insulated gate bipolar transistor according to claim 1, further comprising a buffer layer of the first conductivity type arranged between the collector layer and the drift layer.

3. The insulated gate bipolar transistor according to claim 2, wherein the collection areas extend vertically through the drift layer from the trench gate electrodes and the trench Schottky electrode to the buffer layer.

4. The insulated gate bipolar transistor according to claim 1, wherein the collection areas have a retrograde profile, so that a doping concentration of the second conductivity type at the contact area is lower than a doping concentration of the second conductivity type at the collector side of the collection areas.

5. The insulated gate bipolar transistor according to claim 1, further comprising an enhancement layer of the first conductivity type formed between the base layer and the drift layer, the enhancement layer having higher doping concentration than the drift layer.

6. The insulated gate bipolar transistor according to claim 5, wherein the trench gate electrodes and the trench Schottky electrode extend through the enhancement layer into the drift layer.

7. An insulated gate bipolar transistor comprising:
    a source electrode;
    a source layer of a first conductivity type electrically contacting the source electrode;
    a base layer of a second conductivity type electrically contacting the source electrode, the second conductivity type being different from the first conductivity type;
    a drift layer of the first conductivity type spaced from the source electrode by the base layer;
    a collector layer of the second conductivity type;
    a collector electrode electrically contacting the collector layer, wherein the collector layer is arranged between the drift layer and the collector electrode;
    a first trench gate electrode extending through the base layer into the drift layer;
    a first channel adjacent the first trench gate electrode and located between the base layer, the source layer, and the drift layer;
    a first collection area of the second conductivity type located in the drift layer adjacent a bottom portion of the first trench gate electrode;
    a second trench gate electrode extending through the base layer into the drift layer;
    a second channel adjacent the second trench gate electrode and located between the base layer, the source layer, and the drift layer;

a second collection area of the second conductivity type located in the drift layer adjacent a bottom portion of the second trench gate electrode;

a trench Schottky electrode disposed within the base layer between the first trench gate electrode and the second trench gate electrode, the trench Schottky electrode comprising an electrically conductive Schottky layer extending through the base layer into the drift layer, wherein the electrically conductive Schottky layer is electrically connected to the source electrode; and a third collection area of the second conductivity type located in the drift layer adjacent a bottom portion of the trench Schottky electrode, wherein the electrically conductive Schottky layer forms a Schottky contact at a contact area between the third collection area and the bottom portion of the trench Schottky electrode.

8. The insulated gate bipolar transistor according to claim 7, wherein the first trench gate electrode and the second trench gate electrode each comprise an electrically conductive gate layer and a gate insulating layer that separates the electrically conductive gate layer from any doped layer.

9. The insulated gate bipolar transistor according to claim 7, wherein the trench Schottky electrode further comprises a Schottky insulating layer separating the electrically conductive Schottky layer from the base layer.

10. The insulated gate bipolar transistor according to claim 7, further comprising a buffer layer of the first conductivity type arranged between the collector layer and the drift layer.

11. The insulated gate bipolar transistor according to claim 10, wherein the first, second and third collection areas extend vertically through the drift layer.

12. The insulated gate bipolar transistor according to claim 7, wherein the first, second and third collection areas have a retrograde profile, so that a doping concentration of the second conductivity type at the contact area is lower than a doping concentration of the second conductivity type at a collector side of the collection areas.

13. The insulated gate bipolar transistor according to claim 7, further comprising
an enhancement layer of the first conductivity type having higher doping concentration than the drift layer, wherein the enhancement layer is formed between the base layer and the drift layer.

14. The insulated gate bipolar transistor according to claim 13, wherein the first and second trench gate electrodes and the trench Schottky electrode extend through the enhancement layer into the drift layer.

15. An insulated gate bipolar transistor comprising:
a source electrode;
a source layer of a first conductivity type electrically contacting the source electrode;
a base layer of a second conductivity type electrically contacting the source electrode, the second conductivity type being different from the first conductivity type;
a drift layer of the first conductivity type spaced from the source electrode by the base layer;
an enhancement layer of the first conductivity type between the base layer and the drift layer, the enhancement layer having higher doping concentration than the drift layer;
a collector layer of the second conductivity type;
a buffer layer of the first conductivity type arranged between the collector layer and the drift layer;
a collector electrode electrically contacting the collector layer, wherein the collector layer is arranged between the drift layer and the collector electrode;
a first trench gate electrode extending through the base layer into the drift layer;
a first channel within the base layer adjacent the first trench gate electrode and extending from the source layer to the drift layer;
a first collection area of the second conductivity type located in the drift layer adjacent a bottom portion of the first trench gate electrode;
a second trench gate electrode extending through the base layer into the drift layer;
a second channel within the base layer adjacent the second trench gate electrode and extending from the source layer to the drift layer;
a second collection area of the second conductivity type located in the drift layer adjacent a bottom portion of the second trench gate electrode;
a trench Schottky electrode disposed within the base layer between the first trench gate electrode and the second trench gate electrode, the trench Schottky electrode comprising an electrically conductive Schottky layer extending through the base layer into the drift layer, wherein the electrically conductive Schottky layer is electrically connected to the source electrode; and
a third collection area of the second conductivity type located in the drift layer adjacent a bottom portion of the trench Schottky electrode, wherein the electrically conductive Schottky layer forms a Schottky contact at a contact area between the third collection area and the bottom portion of the trench Schottky electrode.

16. The insulated gate bipolar transistor according to claim 15, wherein the first trench gate electrode and the second trench gate electrode each comprise an electrically conductive gate layer and a gate insulating layer that separates the electrically conductive gate layer from any doped layer.

17. The insulated gate bipolar transistor according to claim 15, wherein the trench Schottky electrode further comprises a Schottky insulating layer separating the electrically conductive Schottky layer from the base layer.

18. The insulated gate bipolar transistor according to claim 15, wherein the first, second and third collection areas extend vertically through the drift layer.

19. The insulated gate bipolar transistor according to claim 15, wherein the first, second and third collection areas have a retrograde profile, so that a doping concentration of the second conductivity type at the contact area is lower than a doping concentration of the second conductivity type at a collector side of the collection areas.

20. The insulated gate bipolar transistor according to claim 15, wherein the first and second trench gate electrodes and the trench Schottky electrode extend through the enhancement layer into the drift layer.

* * * * *